United States Patent
Narayan

(10) Patent No.: US 6,992,322 B2
(45) Date of Patent: Jan. 31, 2006

(54) PHOTO-RESPONSIVE ORGANIC FIELD EFFECT TRANSISTOR

(76) Inventor: Kavassery Sureswaran Narayan, Jncasr, Jakkur P.O., Bangalore 560064 (IN)

(*) Notice: Subject to any disclaimer, the term of this patent is extended or adjusted under 35 U.S.C. 154(b) by 399 days.

(21) Appl. No.: 10/033,743

(22) Filed: Dec. 28, 2001

(65) Prior Publication Data

US 2002/0084504 A1    Jul. 4, 2002

Related U.S. Application Data

(60) Provisional application No. 60/259,375, filed on Jan. 2, 2001.

(51) Int. Cl.
  *H01L 51/00*  (2006.01)
(52) U.S. Cl. .................................................. 257/40
(58) Field of Classification Search ............... 257/40, 257/53, 54, 55, 56, 225, 226, 227, 228, 229, 257/257, 258, 288, 290, 291, 292, 293, 294, 257/414, 431, 432, 433, 434, 435, 436, 437, 257/438, 439, 440, 441, 442, 443, 444, 445, 257/446, 447, 448, 449, 450, 451, 452, 453, 257/454, 455, 456, 457, 458, 459, 460, 461, 257/462, 463, 464, 465, 466
See application file for complete search history.

(56) References Cited

U.S. PATENT DOCUMENTS

| | | | |
|---|---|---|---|
| 4,613,881 A * | 9/1986 | Nishizawa | |
| 5,292,792 A | 3/1994 | Carew | 524/550 |
| 5,328,809 A | 7/1994 | Holmes et al. | 430/321 |
| 5,329,112 A * | 7/1994 | Mihara | |
| 5,347,144 A * | 9/1994 | Garnier et al. | |
| 5,376,502 A | 12/1994 | Novak et al. | 430/270 |
| 5,454,880 A | 10/1995 | Sariciftci et al. | 136/263 |
| 5,523,555 A | 6/1996 | Friend et al. | 250/214 R |
| 5,569,565 A * | 10/1996 | Kawakami et al. | |
| 5,596,208 A * | 1/1997 | Dodabalapur et al. | |
| 5,670,791 A | 9/1997 | Halls et al. | 257/40 |
| 5,677,041 A | 10/1997 | Smayling | 428/209 |
| 5,677,545 A | 10/1997 | Shi et al. | 257/40 |
| 5,705,826 A * | 1/1998 | Aratani et al. | |
| 5,898,168 A * | 4/1999 | Gowda et al. | |

(Continued)

OTHER PUBLICATIONS

Bao et al., "Soluble processable regioregular poly(3-hexylthiophene) for thin film field-effect transistor applications with high mobility," Applied Physics Letters 69 (26), p. 4108-4110, 1996.*

(Continued)

*Primary Examiner*—Nathan J. Flynn
*Assistant Examiner*—Kevin Quinto
(74) *Attorney, Agent, or Firm*—Choate, Hall & Stewart LLP

(57) ABSTRACT

A polymer-based field effect transistor photosensitive to incident light, which may enhance the transistor's characteristics and controlling parameters of the transistor state. The transistor is comprised of a metal-insulator-semiconductor structure with the insulating and semiconducting layers made of a polymeric media. The semiconducting polymer which also is photoconducting, forms the charge transport layer between the source and drain. The transistor exhibits large photosensitivity indicated by the sizable changes in the drain-source current, by a factor of 100–1000 even at low levels of light with illumination of approximately 1 mlux. The photosensitivity of the transistor is further enhanced with introduction of dilute quantity electron acceptor moieties in the semiconducting polymer matrix. Several applications of the light-responsive polymer-transistor are disclosed, such as use as a logic element and as a backbone of an image sensor.

1 Claim, 6 Drawing Sheets

U.S. PATENT DOCUMENTS

| | | | |
|---|---|---|---|
| 5,908,583 A | 6/1999 | Havinga et al. | 252/500 |
| 5,981,970 A * | 11/1999 | Dimitrakopoulos et al. | |
| 5,998,804 A | 12/1999 | Suh et al. | 257/40 |
| 6,060,338 A | 5/2000 | Tanaka et al. | 438/99 |
| 6,159,779 A | 12/2000 | Huang et al. | 438/158 |
| 6,204,515 B1 | 3/2001 | Bernius et al. | 257/40 |
| 6,215,241 B1 * | 4/2001 | Haven et al. | |
| 6,246,105 B1 | 6/2001 | Morozumi et al. | 257/640 |
| 6,271,107 B1 | 8/2001 | Massingill et al. | 438/597 |
| 6,303,943 B1 * | 10/2001 | Yu et al. | |
| 6,323,309 B1 | 11/2001 | Swager et al. | 528/380 |
| 6,329,226 B1 * | 12/2001 | Jones et al. | |
| 6,331,356 B1 | 12/2001 | Angelopoulos et al. | 428/411.1 |
| 6,480,577 B1 * | 11/2002 | Izumi et al. | |
| 6,603,139 B1 * | 8/2003 | Tessler et al. | |

OTHER PUBLICATIONS

Bao, et al., "Soluble and Processable Regioregular poly(3-Hexylthiophene) for Thin Film Field-Effect Transistor Applications with High Mobility", *Appl. Phys. Lett.* 69(26): 4108-4110, 1996.

* cited by examiner

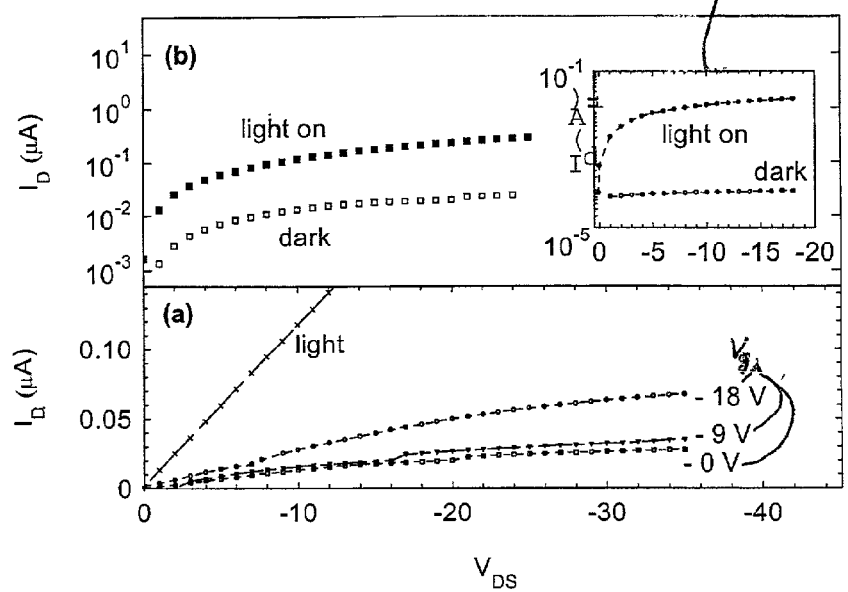

PHOTO-RESPONSIVE ORGANIC FIELD EFFECT TRANSISTOR

The present application claims the benefit of priority of U.S. Provisional Application No. 60/259,375, filed Jan. 2, 2001, the contents of which are herein incorporated by reference in their entirety.

FIELD OF THE INVENTION

The instant invention is related generally to the field of transistors. More specifically, the present invention related to transistors based on semiconducting polymers and the use and manufacture of said transistors.

BACKGROUND OF THE INVENTION

Classical MIS structure field-effect transistors, commonly called MISFETs or MOSFETs, are generally formed on a silicon substrate strongly doped to make the transistors conduct. A metal layer is deposited on one surface of the substrate so that the grid voltage can be applied. An insulating silica layer is grown on the other surface of the substrate. A semiconducting layer and the two metal contacts constituting the source and drain are applied to this silica layer. The source and drain may be in contact with the insulating layer or disposed above the semiconducting layer. It has been shown over the last decade that the insulator in the MISFET structure can be replaced by insulating polymers with dielectric constants exceeding silica, and that the semiconductor components in MISFETs can be replaced by a conjugated semiconducting polymer or organic molecules with aromatic structures of finite molecular weight. This choice of transistor components has enabled applications where requirements of flexibility over a large area are required. A particular need for such organic-FET transistors is in display applications, for example, as an option to amorphous silicon based thin film vast transistors for driving the light emitting diodes (LEDs). Another application is in development of active-matrix drive circuits printed on plastic media. The transistors in these circuits are made of plastic materials and are fabricated with a low-cost printing process that uses high-resolution rubber stamps. Their switching properties are similar to typical thin film transistors manufactured from silicon and through conventional fabrication methods, but they are mechanically flexible, rugged and lightweight.

Advances in crystal growth techniques of organic molecules with much lower degrees of defects have led to tremendous improvements of material characteristics resulting in enhanced transistor properties. The improvements in polymer-transistor characteristics over the last decade were possible due to improvement of polymers used, in terms of purity and orientation methods. Regioregular polyalkylthiophenes P3ATs have been shown to self-assemble into such films, with the molecules adopting a preferred orientation with respect to the substrate. Consequently, it has been shown that semiconducting polymers with mobilities as high as 0.1 $cm^2$/V-s can be realized.

The photosensitivity of these polymers significantly increases upon dispersing electron acceptors such as derivatised buckminsterfullerene $C_{60}$, viologen, nanoparticles of $TiO_2$, CdS and other such materials with suitable energy levels for accepting the photogenerated electron in the polymer matrix. Device fabrication with composites of conjugated polymers and $C_{60}$ as the active layer with efficient photo-induced charge transfer preventing the initial e-h recombination has resulted in efficient organic photodiodes and photovoltaic cells. A prerequisite for such an enhancement are materials with high electron affinity with a distribution in the polymer matrix such that the interparticle distances is on the order of the exciton diffusion length. In addition, the charge separation process must be fast enough to compete with the radiative and nonradiative decay pathways of the excited species, which is in the range of 100 ps to 1 ns.

One of the applications of silicon technology is in the field of image sensors. As is well known, an image sensor is a semiconductor device for sensing a light reflected from an object to generate image data. A photo-transistor, unlike a photo-diode, is a high output impedance (light-controlled) current source. Also, the output impedance of a phototransistor can be rendered independent of the size of its photosensing junction, while the output impedance of a photo-diode cannot. Photo-transistors are more effective sensors than photo-diodes in certain applications because of these two properties. Such applications include those in which the voltage output of the loaded sensor is limited by the impedance of the sensor rather than the dynamic range of the load.

An optically activated FET using organic semiconductors without an explicit insulating layer but where the aluminum shottky gate region forms the active region has been reported. High sensitivity to light in n-channel silicon-on-insulator (SOI) metal oxide FET which operates in the inversion mode has been demonstrated. The photodetector comprises a short-channel SOI film with a negatively biased gate electrode. Under illumination, electrons generated in the semiconductor flow away from the channel region and into the drain whereas the photogenerated holes remain in the channel. Positive charges of the remaining holes bias the source-channel junction forward, leading to large drain current.

SUMMARY OF THE INVENTION

It is an object of the present invention to provide improved electronic devices using electrically conductive, photosensitive polymers.

In one aspect, the present invention is a photosensing organic field effect transistor (POFET) comprising a substrate insulating layer having a high relative dielectric constant and a first side and a second side, an electrically conducting gate electrode positioned adjacent to the first side of the insulating layer, a semiconducting polymer layer responsive to incident light and having first and second sides and first and second ends wherein the second side is the side adjacent to the second side of the insulating layer, an electrically conducting source electrode in electrical contact with the first end of the semiconductor layer, and an electrically conducting drain electrode in electrical contact with the second end of the semiconducting polymer layer.

The semiconducting polymer layer preferably has a field effect mobility of $10^{-2}$ $cm^2$/V-sec or greater, and further comprises a polymer matrix including regioregular polyalkylthiophenes with 98.5% head-to-tail regiospecific conformation and, in dilute quantities, one or more electron acceptors selected from the group consisting of buckminsterfullerene $C_{60}$ and derivatives thereof, viologen, dichlorodicyano-benzoquinone, nanoparticles of titanium dioxide, nanoparticles of cadmium sulphide and the like, thereby enabling electron transfer from the polymer matrix upon photoexcitation in order to obtain a high photo-induced current between the drain and source electrodes.

The insulating layer preferably is at least partially transparent to optical radiation and has a dielectric constant of 3.0 or greater. The insulating layer may be comprised of a polymeric material, such as polyvinyl alcohol (PVA) or polymethyl methacrylate (PMMA), or may be comprised of an inorganic material. The gate electrode is also preferably partially transparent.

One operational characteristic of a transistor in accordance with the present invention is that the transistor drain current and ON state are independently controllable by a voltage applied to the gate electrode and/or by the intensity of light incident upon the transistor. Transistor saturation current gains of greater than 100 may be achieved by judicious selection of transistor materials, dimensions, and appropriate photoexcitation and biasing.

In another aspect, the present invention is a method of fabricating a photosensing organic field effect transistor, comprising the steps of: coating a glass substrate with a semi-transparent gate electrode; depositing upon the gate electrode an electrically insulating layer having a first side and a second side, the first side adjacent to the gate electrode; forming on the second side of the insulating layer a semiconducting polymer layer comprised of a regioregular polyalkylthiophene responsive to incident light and having a 98.5% head-to-tail regiospecific conformation; and forming on the semiconducting polymer layer electrically conducting source and drain electrodes.

In yet another aspect, the present invention comprises applications of the transistor described herein. One such application is the use of the transistor as a logical element. Another such application is the use of the transistor as a backbone of a position sensitive detector. The implementation of these uses is described below.

BRIEF DESCRIPTION OF THE DRAWINGS

FIG. 2A is a graph upon which is plotted drain current $I_d$ versus drain-source voltage $V_d$ for different gate bias $V_g$ with and without incident light of 1 mW/cm$^2$.

FIG. 2B is a graph upon which is plotted (in log scale) $I_d$ with and without incident light of 1 mW/cm$^2$ at $V_g$=0.

FIG. 2C is a graph upon which is plotted (in log scale) $I_d$ versus $V_d$ for a device with a thicker P3OT layer than in FIG. 2A and with a light intensity of 20 mW/cm$^2$.

DETAILED DESCRIPTION OF CERTAIN EMBODIMENTS

Preferred embodiments of the invention will now be described with reference to the accompanying drawings.

Figure 1A:
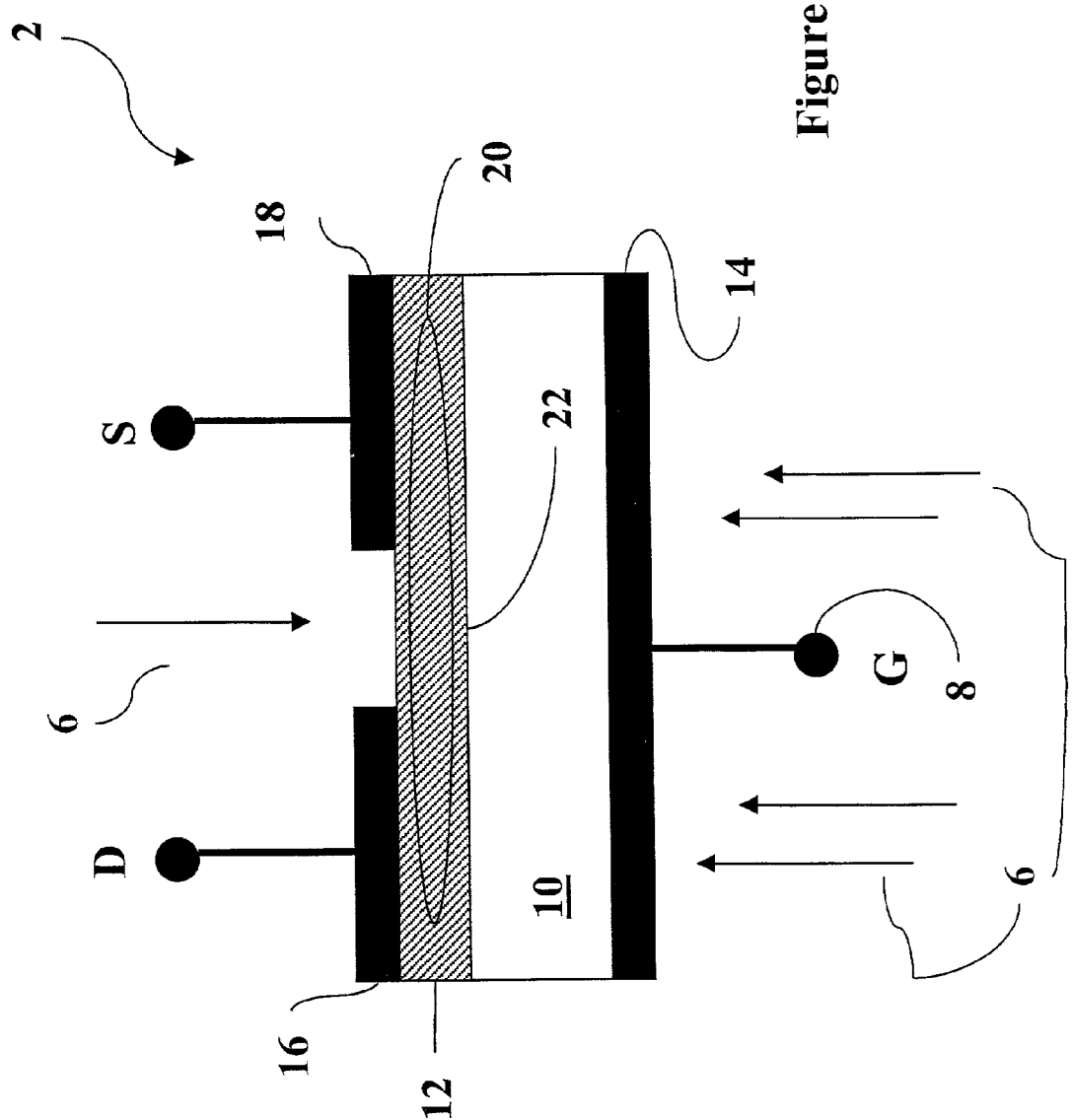
FIGS. 1A, B are schematic diagrams illustrating top-contacting and bottom-contacting configurations of a photo-FET structure in accordance with the present invention.
Figure 1B:
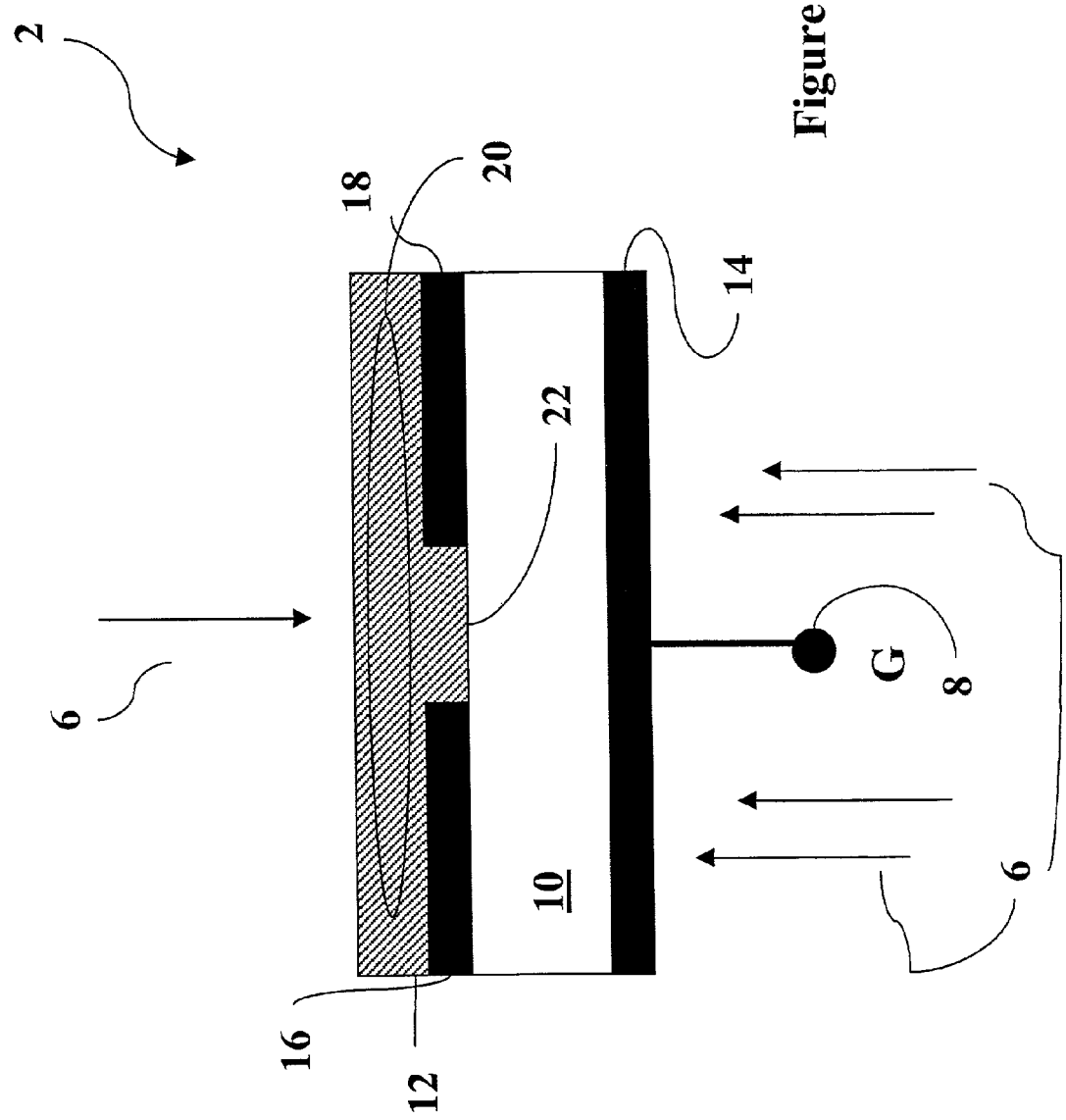

In one aspect, the present invention is directed to a polymer FET 2 (as depicted in FIGS. 1A and 1B) whose transistor action is considerably modified upon photoexcitation, with large changes in the drain-source current $I_{ds}$. The saturation value of $I_{ds}$ can be independently controlled by the intensity of incident light 6 and/or a voltage $V_g$ applied to a gate 8. . The large photo-induced drain current is a consequence of an internal amplification process resulting from the photogenerated carriers that is possible only in this transistor configuration.

In another aspect, the present invention is a method to improve polymer-transistor characteristics, and in another, a novel low-noise, sensitive photodetector device. The applicant demonstrates that in an organic FET 2, the incident light 6 intensity can act as a an added control parameter in the FET's operation, thereby adding another functional aspect to the variety of applications of polymer transistors. The applicant herein suggests methods to enhance the performance of the light responding transistor. The polymer components in the FET are deposited at room temperature using a simple solution deposition method employing common organic solvents. Potential applications for FETs in accordance with the present invention include their use as flexible image sensors, photoactivated switches and photogenerated-charge storage devices.

In one embodiment, a photosensing 3-terminal polymer based FET 2 is comprised of an insulating polymer layer 10 with a high relative dielectric constant, a semiconducting-photoconducting polymer layer 12, and metal electrodes 14, 16, 18 in either top-contacting or bottom-contacting transistor element configurations, as shown in FIGS. 1A and 1B respectively. The semiconducting-photoconducting layer 12 is comprised of a polymer matrix including regioregular polyakyl thiophene polymers P3ATs with regiospecific configurations optimal for semiconducting polymers.

Electron acceptors such as derivitised $C_{60}$, $TiO_2$ nanoparticles, dye-coated $TiO_2$ and 2,3-dichloro-5,6-dicyano-1,4 benzoquinone (DDQ) can also be incorporated in the semiconducting polymer matrix at appropriate concentration levels to obtain a high photo-induced response.

More specifically, the polymer matrix includes semiconducting polymer regioregular Poly(3-octylthiophene), P3OT, and Poly(3-hexylthiophene) with 98.5% head-to-tail regiospecific conformation. The polymer matrix can be coated on insulating, transparent, high dielectric constant insulators such as polyvinylalcohol (PVA) or polymethylmethacrylate (PMMA).

The photosensing 3-terminal polymer based FET 2 described herein may be used as a logical element whereby the transistor can be switched to an ON state either by the incident light 6 or by applying a voltage to gate electrode 14. In addition, the FET 2 can be used as the backbone of an image sensor with large patterning possible due to an expected strong variation of the drain current with the spatial position of the incident light beam. The charge storage capability of the structure with further modifications known to one skilled in the art of conventional semiconductors can be exploited for memory related applications.

The photosensing 3-terminal polymer based FET 2 may also be used to control other phenomena, such as superconductivity, which arise from the gate-induced carriers in the channel region 20. The ability of incident light 6 to modulate the carriers at the interface 22 is maintained down to the superconducting transition temperature.

The insulator medium for the insulating layer 10 can be polymeric media such as PMMA or PVA, or conventional insulator media such as $SiO_2$. Transparent insulators offer the advantage of having light 6 incident from the gate electrode 14 side of the FET 2, thereby increasing the sensitivity of the device. The solubility of the dielectric polymer is an important processing factor. Soluble insulating dielectric polymers such as PVA and PMMA can be cast on a glass substrate coated with a partially transparent gate metal electrode 14 to form layers of controlled thickness in the range 0.2–1.0 micron. The nature of the semiconductor polymer-insulator polymer interface 22 plays a decisive role in the FET characteristics. Regioregular polyalkythiophene polymers P3ATs, with 98.5% head to tail regiospecific conformation, which are reported to have mobilities greater than 0.01 $cm^2$/V-sec can be used in the semiconducting-photoconducting polymer layer 12. The introduction of electron acceptors such as $C_{60}$, $TiO_2$ nanoparticles, dye-coated $TiO_2$, and DDQ, even in extremely dilute quantities, can result in tremendously high photo-induced response. P3ATs may be dissolved in chloroform and spin coated on the insulator to yield a 100 nm thick film. Uniform bilayers of the polymers with a sharp interface 22 is possible with use of compatible solvents, thermal treatment procedures and an electrostatic-surface treatment of the insulator layer 10.

Gold electrodes, in the range of 0.1 mm–1 mm wide with an inter-electrode spacing of 10 microns–70 microns, determine the carrier channel length, with a typical channel width/channel length ratio of ~100. The gold electrodes of thickness t~100 nm (t<<channel length) form the source electrode 18 and drain electrode 16 and are deposited on the P3AT polymer layer 12. Referring to the structure depicted in FIG. 1A, it is to be noted that the source electrode 18 and drain electrode 16 are on top of the thin, active semiconductor layer 12 for these devices, instead of having the semiconductor layer on top of the drain-source electrodes. This arrangement results in a more homogenous P3AT layer along with additional physical effects which assist the light induced processes. This configuration permits the design of an array of FETs with a desired patterning of gate electrode 14 or the gate and source electrodes in the initial and the final stages using conventional metal masks. The light 6 can access the photosensitive semiconductor layer 12 from both the gate side as well as the source and drain side directly into the semiconductor layer. The majority of organic semiconductors exhibit p-type behavior; i.e., the majority carriers are holes (h+). Their I-V characteristics can be adequately described by models developed for inorganic semiconductors. However, there are modifications which arise from the differences in the transport mechanism in the polymer-semiconductors compared to conventional semiconductors.

Upon illumination, the drain-source current $I_{ds}$ can increase by orders of magnitude. FIGS. 2A and 2B depict the characteristics of a polymer transistor $I_{ds}$–$V_{ds}$ at different $V_g$. Light incident on the region between the drain and source significantly increases $I_{ds}$. As seen from the results in FIG. 2B, the effect of light 6 on a polymer FET 2 can be viewed simplistically as an equivalent to a large gate bias, with an enhanced value of $I_{ds}$. Other effects such as the decrease of threshold $V_{ds}$ necessary to drive $I_d$ to saturation with light is also observed. The gate bias has been viewed as a method of doping the organic semiconductor, $n = CV_g/e$ where n is the charge carrier density. For example, a gate bias in the range of 200 V, for a p-channel FET comprised of P3HT, can be viewed as the equivalent of increasing the sheet density to $10^{13}$–$10^{14}$ per $cm^2$, depending on the geometry of the structure. In fact, it has been shown that at temperatures below 2.35 K and sheet carrier densities exceeding $2.5 \times 10^{14}$ per $cm^2$ a polythiophene film becomes superconducting. (See "*Gate Induced Superconductivity in a Solution Processed Polymer Film*", Schon, et al., *Nature*, Vol. 410, 189–192, 2001.) The effect of incident light can similarly result in an equivalent action, similar to the large gate bias in terms of increasing the carrier density depending on the degree of photogenerated electron-hole separation.

This photoeffect is substantially more pronounced than a mere linear process involving photo-induced charge carrier generation in presence of a lateral electric field. The substantial increase in $I_{ds}$ upon illumination needs to be understood in the context of the following observed features in P3AT top-contacting FETs: (i) unipolar (hole) transport in the channel; (ii) accumulation of charges beneath the drain and source contacts; (iii) minority carrier (electron) vertical diffusion process; (iv) strong non-linear dependence of the drain source current on the light intensity (below the saturation threshold); and (v) increases in $I_{ds}$ at moderately-high light-intensity regions, both in enhancement and depletion modes, with a marginally higher value of near-saturated light induced $I_d^{light}$ in the enhancement mode. $I_d^{light}$ in this light-intensity range is dependent on $V_g$.

The additional factors present for $I_d^{light}$ besides the lateral field become more obvious upon comparison with a planar, surface configured, 2-terminal photodetector device. The scenario upon illumination of the device is the generation of e-h pairs in the channel region of the P3OT layer as well as in the bulk region. The typical transistor type $I_d^{light}$-$V_d$ behavior with the presence of saturation region indicates that the $I_d^{light}$ is also channel restricted. The electrons diffuse away from the channel causing a largely vertical electron-hole separation. The potential has a minimum at the location where the holes can flow between source and drain. The holes from the bulk, which are created by electric field and thermally assisted processes, drift towards the channel. Electrons remaining in the bulk can bias the source channel forward leading to a large $I_{ds}$ with a self-biased base structure under illumination. In other words, the amplification in $I_{ds}$ due to light arises from these independent pathways for the holes and the electrons.

In the present case, it is clear that there are different mechanisms, i.e., at low light level where the $V_g$ is a controlling factor for $I_{ds}$ and at higher light intensities where $I_{ds}$ is weakly dependent on $V_g$. The switching response due to photoexcitation, indicated by the time constant for rise and decay, are related to the charging and discharging process of the bulk P3OT and gate, with the electron accumulation and removal from the bulk. The $I_{ds}$ decay is clearly faster in the depletion mode than in the accumulation mode, indicating a gate dependent factor in $I_d^{light}$. The decay rates are also influenced by parameters such as the initial light intensity, temperature, insulator and P3OT thickness (not shown). The ability to control the decay rates should also lead to the use of such FETs in memory related applications.

It is expected that the photo-responsivity at low-light levels in the transistor devices, which is in the order of 1 A/W, can easily be increased to 100 A/W by optimizing the transistor geometry parameters, increasing the degree of order of the active polymer, improving the photosensitivity by introducing dilute quantity of electron acceptors, without significantly altering the interface homogenity, tailored to facilitate photoinduced electron transfer.

EXAMPLE

A FET 2 with P3OT comprising the semiconducting-photoconducting layer 12 and PVA comprising the insulating layer 10 was fabricated. PVA, which is soluble in warm water (50° C.) and transparent, was cast on a glass substrate coated with a partially transparent (10%) gate aluminum electrode 14 to form a uniform layer. The insulating layer coated on the substrate was thoroughly dried. Regioregular Poly (3-octylthiophene), P3OT, and Poly (3-hexylthiophene) with a 98.5% head to tail regiospecific conformation was obtained commercially from Aldrich Inc., USA and used as received. P3OT was dissolved in chloroform and spin coated on the insulator layer 10 to yield a 100 nm thick layer 12. Uniform bilayer of the polymers with a sharp interface 22 was possible partly due to different solvents. Gold electrodes, 3 mm wide with an inter-electrode spacing of 70 microns, forming the channel length, was deposited on the P3OT layer 12 to form the source electrode 18 and drain electrode 16. The leakage current in the drain-gate and gate-source circuits was insignificant and was monitored to ensure that they did not affect the photo-FET characteristics. The consistency of the results was established by fabricating and studying many such devices.

FIG. 2A shows the FETs characteristics, which essentially represent a typical p-channel enhancement type metal-insulator (PVA)-semiconductor (P3OT) FET, with increasing $I_{ds}$ as $V_g$ is biased more negative. The field effect mobility of P3OT was estimated to be in the range of $10^{-2}$–$10^{-3}$ cm$^2$/V-sec on the basis of $I_{ds}$–$V_{ds}$ measurements carried on several such devices. The value obtained for regioregular polyhexylthiophene, which has shorter side chain length, is marginally higher.

Figure 3A:
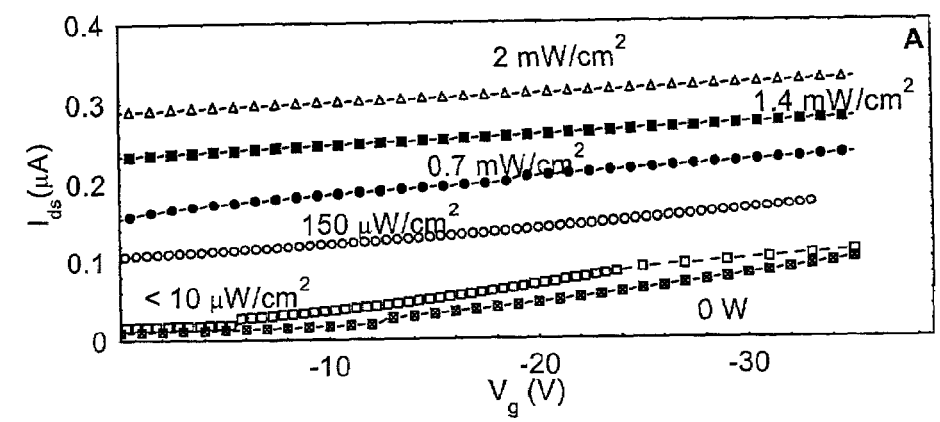
FIG. 3A is a graph upon which is plotted $I_d$ versus $V_g$ at different light intensities with $V_d$=9 V.
Figure 3B:
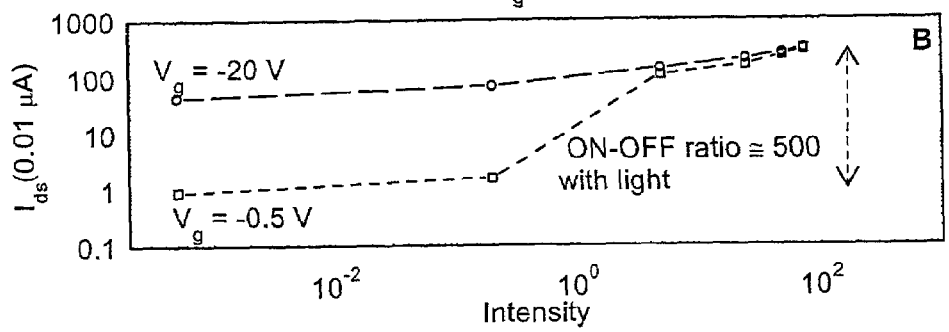
FIG. 3B is a log-log plot of drain current in an initial OFF state ($V_g$=-0.5 V) and in an initial ON state ($V_g$=-20 V) versus normalized light intensity.

FIG. 2B shows the $I_{ds}$ response to light 6 incident from the gate side (1 mW/cm$^2$, 532 nm) without any gate bias. As can be seen, the effect of light can be viewed simplistically as an equivalent to a large gate bias, with an enhanced value of $I_{ds}$. It was observed that the threshold $V_{ds}$ necessary to drive $I_d$ to saturation also decreases with light. The current gain, $I_d^{light}/I_d$, due to light (photon flux rate 1 W) in this case is 100. It was also observed that the gain ($I_d^{light}/I_d$) can be further increased to as high as 1000 for certain devices, with higher flux rates and a thicker P3OT (150 nm) layer as shown in FIG. 2C. The dependence of $I_d^{light}$ on the gate bias $V_g$ is significant only at low light intensity, as shown in FIG. 3A, with a weak linear dependence on $V_g$ at higher incident intensity. The large $I_d^{light}$ was observed both for the enhanced and depleted modes of the FET. The effectiveness of light as a gate element is more obviously illustrated in FIG. 3B. The dependence of $I_{ds}$, which is initially in the OFF state (Vg=−0.5 V), on the light intensity is shown in FIG. 3B. The $I_d$-Intensity response is non-linear in this region and highlights the sensitivity of the device at low levels of light flux. To the best of the applicant's knowledge, the results reported here include the highest responsivity (1 A/W) at low light levels for polymer/organic based photodetectors, which until now have all been based on non-amplifying 2-terminal configurations.

The control aspect of the light, similar to the gate bias in a standard FET, gives rise to interesting features as highlighted in these results. The ON state in this particular device, for instance, can be attained by different mechanisms: (i) normal FET mode without light and with only gate bias; (ii) FET mode at low light intensity with smaller gate bias values; and (iii) FET mode at high illumination without any gate bias, along with attributes of a multi-level logic system. A single FET with these two independent control options can function as an OR gate.

The present invention differs from a two terminal surface cell polymer-photodetector. This was verified by fabricating the 2-terminal device on a quartz substrate with the same inter-electrode distance as that of the drain-source length (implying similar lateral electric field for charge separation) in the 3-terminal device. $I_{light}$-V characteristics in the two terminal structure are practically linear at voltage bias (0–30 V) and similar to the dark I-V response with a maximum ratio of $I_{light}/I_{dark} \approx 1.4$.

Figure 4:
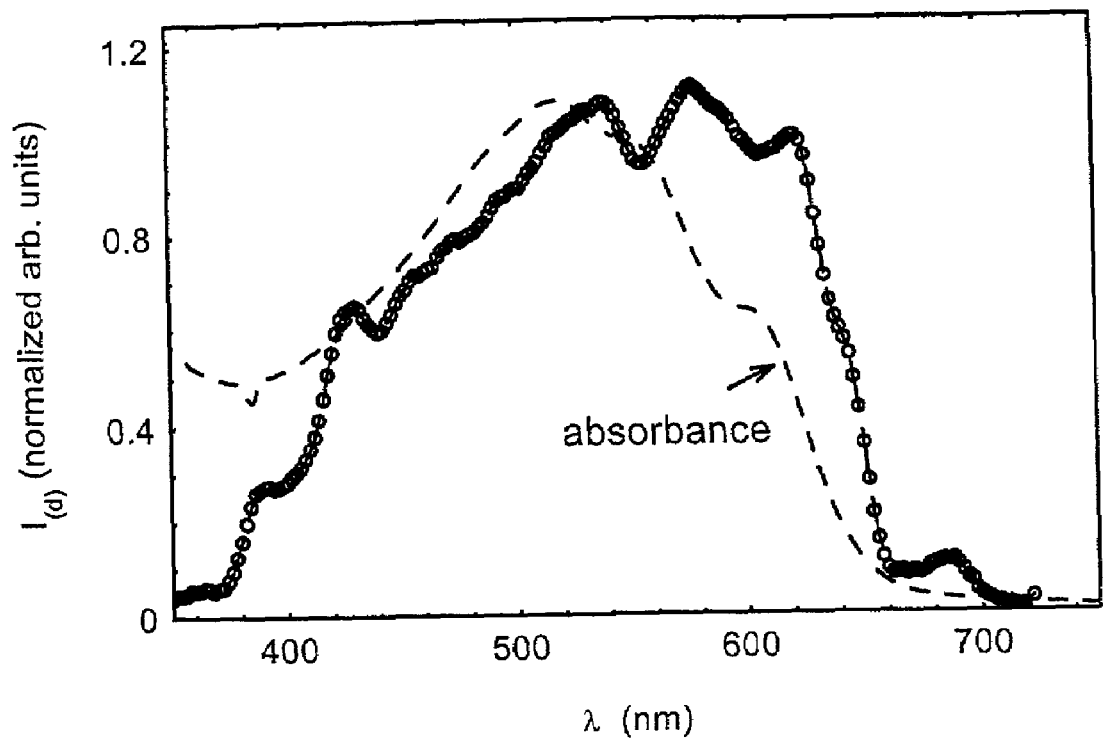
FIG. 4 is a graph upon which is plotted the normalized spectral response of drain photocurrent $I_d$ along with the absorbance of P3OT shown as the dashed line.
Figure 5:
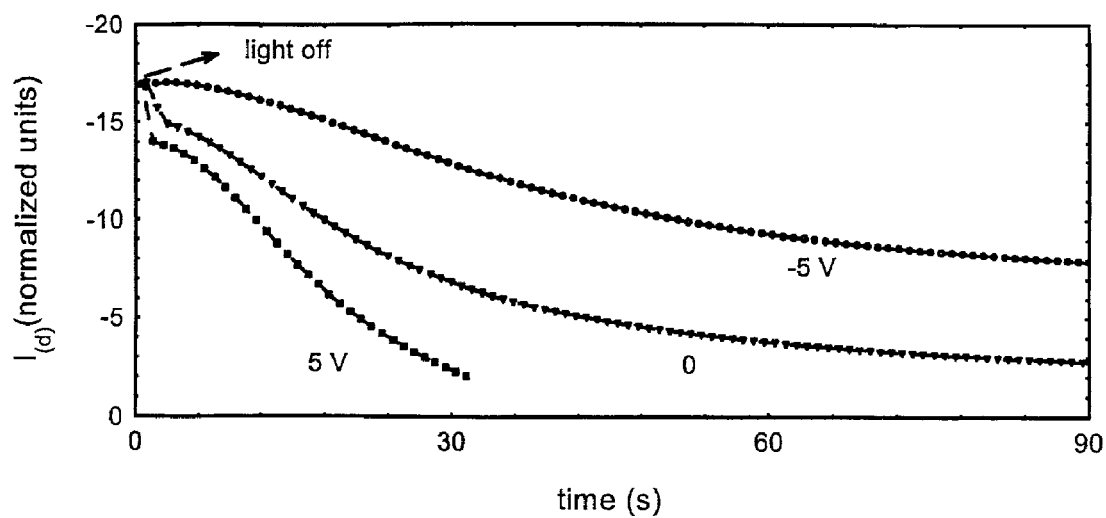
FIG. 5 is a graph upon which is plotted decay curves of the drain current $I_d$ at different $V_g$, wherein time t=0 indicates the point at which the light is switched off.

The process of illuminating the device results in the generation of e-h pairs in the channel region of P3OT layer as well as in the bulk. FIG. 4 illustrates the spectral response of $I_{ds}$ and its similarity to the absorption spectra of the semiconducting polymer. This is evidence of P3OT being the source of photogenerated carriers. The typical transistor type $I_d^{light}$-$V_d$ behavior with a presence of saturation region indicates that the $I_d^{light}$ is also channel restricted. The electrons diffuse away from the channel causing a largely vertical electron-hole separation. In the present case, it is clear that there are different processes contributing to charge transport, i.e., at low light level where the $V_g$ is a controlling factor for $I_{ds}$ and at higher light intensities where $I_{ds}$ is weakly dependent on $V_g$. The switching response due to photoexcitation, indicated by the time constant for rise and decay, are related to the charging and discharging process of the bulk P3OT and gate, with the electron accumulation and removal from the bulk. FIG. 5 shows the current decay when the light is switched off at different $V_g$. The $I_{ds}$ decay is clearly faster in the depletion mode than in the accumulation mode, indicating the gate dependent factor in $I_d^{light}$. The decay rates are also influenced by parameters such as the initial light intensity, temperature, insulator and P3OT thickness (not shown). Experiments with light sources with beam size less than the channel length indicates the sensitivity of the current to the light-position. The strong variation of the drain current with the position of the incident light beam in the region between the drain and source electrode can be exploited in position sensitive photodetector applications.

The spectral response of $I_d$ shown in FIG. 4 essentially covers the entire visible spectral range. The response also reveals the sizable $I_d$ at low-absorption (wavelength>600 nm), indicating the field assisted electron-hole separation processes. It is expected that the photo-responsivity at low-light levels in the transistor devices which is in the order of 1 A/W can be increased to 100 A/W by optimizing the geometry and improving the photosensitivity of the active semiconducting media.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A photosensing organic field effect transistor (POFET), comprising:
   a substrate insulating layer, the insulating layer having a high relative dielectric constant and a first side and a second side;
   a gate electrode, the gate electrode being an electrical conductor, the gate electrode being positioned adjacent to the first side of the insulating layer;
   a semiconducting polymer layer, the semiconducting polymer layer being responsive to incident light, the semiconducting polymer layer having a first side, a second side, a first end and a second end, the second side of the semiconductor layer being adjacent the second side of the insulating layer;
   a source electrode, the source electrode being an electrical conductor, the source electrode being in electrical contact with the first end of the semiconductor layer; and
   a drain electrode, the drain electrode being an electrical conductor, the drain being in electrical contact with the second end of the semiconducting polymer layer, wherein a POFET saturation current gain of 100 or higher may be achieved.

* * * * *